US008995464B2

(12) United States Patent
Yang

(10) Patent No.: US 8,995,464 B2
(45) Date of Patent: Mar. 31, 2015

(54) SUPERPOSITION CODING FOR NETWORK COMMUNICATION

(71) Applicant: The Chinese University of Hong Kong, New Territories (HK)

(72) Inventor: Shenghao Yang, Fanling (HK)

(73) Assignee: Chinese University of Hong Kong, Hong Kong (HK)

( * ) Notice: Subject to any disclaimer, the term of this patent is extended or adjusted under 35 U.S.C. 154(b) by 172 days.

(21) Appl. No.: 13/855,414

(22) Filed: Apr. 2, 2013

(65) Prior Publication Data

US 2013/0308719 A1 Nov. 21, 2013

Related U.S. Application Data

(60) Provisional application No. 61/648,677, filed on May 18, 2012.

(51) Int. Cl.
*H03M 13/13* (2006.01)
*H03M 7/00* (2006.01)
*H03M 13/37* (2006.01)
*H04L 1/00* (2006.01)

(52) U.S. Cl.
CPC ............ *H04L 1/009* (2013.01); *H03M 13/3761* (2013.01); *H04L 2001/0097* (2013.01)
USPC ............................ 370/464; 375/295; 714/799

(58) Field of Classification Search
CPC .................................................. H04L 25/0391
USPC ..................... 370/464; 375/295; 714/759, 799
See application file for complete search history.

(56) References Cited

U.S. PATENT DOCUMENTS

| 7,706,365 | B2 | 4/2010 | Effros et al. | |
|---|---|---|---|---|
| 8,638,244 | B2 * | 1/2014 | Neeman et al. | 341/81 |
| 8,743,992 | B2 * | 6/2014 | Enescu et al. | 375/267 |
| 2006/0203923 | A1 * | 9/2006 | Costa et al. | 375/260 |
| 2010/0110970 | A1 | 5/2010 | Hwang | |
| 2011/0022927 | A1 * | 1/2011 | Sharon et al. | 714/763 |
| 2012/0128009 | A1 * | 5/2012 | Yang et al. | 370/432 |

OTHER PUBLICATIONS

Yang et al, Coding for Linear Operator Channels over Finite Fields, Institute of Network Coding and Dept. of Information Engineering. The Chinese University of Hong Kong; IEEE 2010, pp. 2413-2417.*
Silva et al. Universal Secure Network Coding via Rank-Metric Codes. IEEE Transactions on Information Theory, vol. 57, No. 2, Feb. 2011. pp. 1124-1135.*
Cover, T. M., et al., "Broadcast Channels", IEEE Transactions on Information Theory, vol. IT-18, No. 1, (1972), 2-14.
Ho, T., et al., "A Random Linear Network Coding Approace to Multicast", IEEE Transactions on Information Theory, 52(10), (2006), 4413-4430.

(Continued)

*Primary Examiner* — Ahmed Elallam
(74) *Attorney, Agent, or Firm* — Schwegman Lundberg & Woessner, P.A.

(57) ABSTRACT

The apparatus, systems, and methods described herein may operate to encode a first part of a message into an index, and to encode a second part of the message into a sequence of matrices such that at least one of row spaces or rank of the matrices is determined by the index. Additional apparatus, systems, and methods are described.

20 Claims, 7 Drawing Sheets

(56) References Cited

OTHER PUBLICATIONS

Koetter, R., et al., "Coding for errors and erasures in random network coding", IEEE Trans. Inform. Theory, 54(8), (Aug. 2008), 3579-3591.

Li, S.-Y. R., et al., "Linear Network Coding", IEEE Transactions on Information Theory, 49)2), (2003), 371-381.

Ramchandran, K., et al., "Multiresolution broadcast for digital HDTV using joint source-channel coding", IEEE Journal on Selected Areas in Communications, vol. 11, No. 1, (1993), 6-23.

Silva, D., et al., "A rank-metric approach to error control in random network coding", IEEE Trans. Inform. Theory, 54(9), (Sep. 2008), 3951-3967.

* cited by examiner

SUPERPOSITION CODING FOR NETWORK COMMUNICATION

CROSS REFERENCE TO RELATED APPLICATIONS

The present application claims the priority benefit of U.S. Provisional Patent Application Ser. No. 61/648,677 filed May 18, 2012 and entitled "SUPERPOSITION CODING FOR NETWORK COMMUNICATION," of which application is incorporated herein by reference in its entirety. The present application may be related to United States Patent Application Publication Number 2010/0110970 A1 entitled "WIRELESS NETWORK USING SUPERPOSITION CODING SCHEME" that was published on May 6, 2010. The present application may also be related to U.S. Pat. No. 7,706,365 entitled "RANDOMIZED DISTRIBUTED NETWORK CODING" that was issued on Apr. 27, 2010. The contents of U.S. Patent Pub. No. 2010/0110970 and U.S. Pat. No. 7,706,365 are incorporated herein by reference in their entirety. For general linear operator channels, the coding approach according various embodiments may achieve higher rates than the subspace coding approach proposed by Koetter and Kschischang in "Coding for Errors and Erasures in Random Network Coding", IEEE Trans. Inform. Theory, 54(8), pages 3579-3591, Publication Date August 200.

BACKGROUND INFORMATION

Network coding is a known network transmission technique that generally improves the network throughput and is resilient to packet loss. For example, linear network coding is a known efficient way to achieve the network capacity of multicast. Routing is a special case of linear network coding. Instead of just routing, linear network coding may allow one or more intermediate network nodes to transmit new packets generated by linear combinations of the packets received by an intermediate node.

Linear network coding may be realized, for example, by choosing linear combination coefficients uniformly at random from a finite field, which is called random linear network coding. Random linear network coding may have the advantage that network coding can be implemented in the form of a distribution system in such a way that neither one of a source node and a destination node need to know about the network topology beforehand. Hence it is robustly effective in the face of network topology changes.

For random linear network coding, the network transfer matrix is usually unknown to both the source node and the destination node. Channel training is a widely applied method when using random linear network coding, in which part of input packets may be used to recover the network transfer matrix in the destination node. Channel training is efficient when the overhead used to recover the network transfer matrix is relatively small, compared with the size of the packets. However, channel training may not be efficient, and may not be applied, for example, when the size of overhead is large.

DETAILED DESCRIPTION

Figure 1:
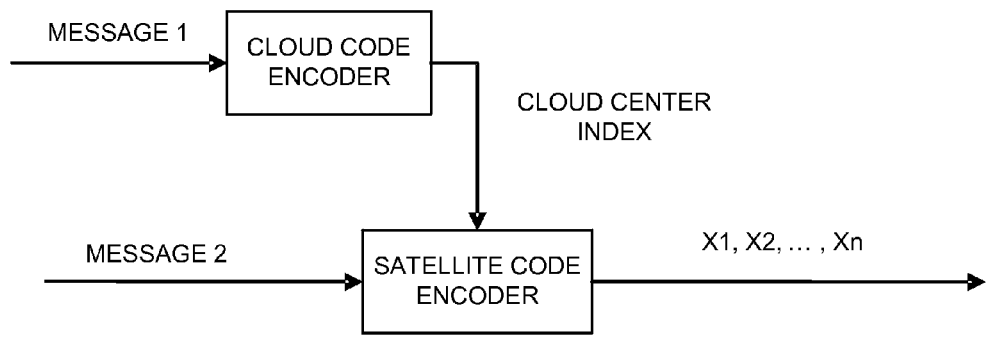
FIG. 1 shows a block diagram of message encoding for a subspace-matrix (rank-matrix) superposition coding scheme, according to various embodiments.
Figure 2:
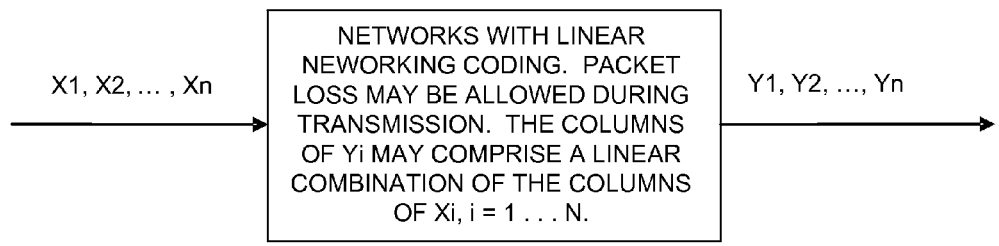
FIG. 2 shows a block diagram of (random) linear network coding for the subspace-matrix (rank-matrix) superposition coding scheme, according to various embodiments.
Figure 3:
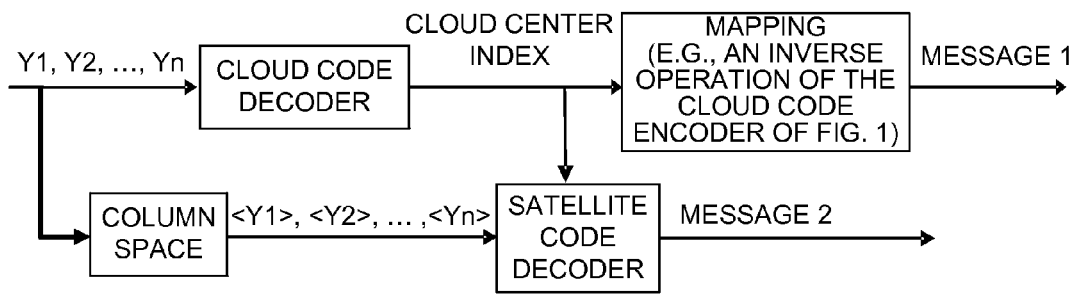
FIG. 3 shows a block diagram of subspace decoding for the subspace-matrix (rank-matrix) superposition coding scheme, according to various embodiments.
Figure 4:
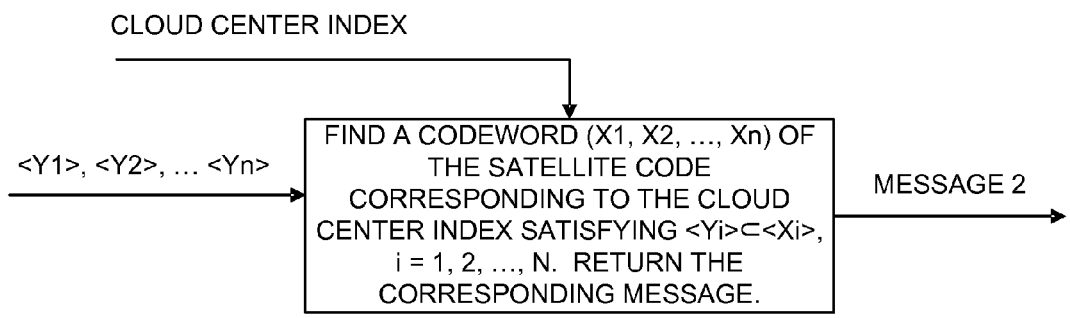
FIG. 4 shows a block diagram of satellite code decoding for the subspace-matrix (rank-matrix) superposition coding scheme, according to various embodiments.

Subspace coding is a more general framework than channel training. Treating a packet as a column vector, the subspace spanned by the output vectors may always be a subset of the subspace spanned by the input vectors. Subspace coding may use properties of linear network coding for encoding and decoding, and may achieve higher rates than channel training. Therefore, subspace coding has generated a lot of research interest. However, designing a practical subspace coding scheme that outperforms channel training is still an unsolved problem.

Various embodiments described herein propose a new coding approach for linear network coding, one that employs a superposition structure. For example, in various embodiments, a structure is proposed to design superposition codes for broadcast channels and/or to design hierarchical modulation for physical layer communications.

Various embodiments of superposition coding may thus be related to methods for network communications. Superposition coding may be employed to improve transformation throughput performance in a network communication system with linear network coding. A coding approach for linear network coding, according to various embodiments, may achieve higher rates than subspace coding does. For example, in various embodiments, linear network coding may employ a superposition structure, which may include a set of cloud centers and a set of satellite codes, each of which corresponds to a cloud center. In various embodiments, a cloud center may comprise a sequence of subspaces, and the satellite code corresponding to the cloud center may contain a set of sequences of matrices. During the encoding, part of the message may first be encoded to a cloud center, and the rest of the message may be encoded to a codeword of the corresponding satellite code. In various embodiments, a cloud center may comprise a sequence of integers specifying the ranks of the matrices forming a codeword of the corresponding satellite code.

In various embodiments, for example, a finite field F with q elements may be fixed, and a matrix may be filled with such elements. A column space and row space of the matrix may comprise subspaces spanned by column vectors and row vectors of the matrix, respectively. The transmission through a network employing linear network coding may be modeled by a linear operator channel with input $X \in F^{T \times M}$ output $Y \in F^{T \times N}$ related by $Y = XH$, where H, called the transfer matrix, is a random variable over $F^{M \times N}$.

Subspace-Matrix Superposition Codes

In various embodiments, for example, for a subspace U of $F^M$, let $\phi_T(U)$ be the set of T×M matrices with row space U. An n-block subspace-matrix superposition (Sumas) code may contain a set of cloud centers, and a number of satellite codes, each of which may correspond to a cloud center. A cloud center $U^n=(U_1, \ldots, U_n)$ may comprise a sequence of n subspace of $F^M$, where the dimension of $U_i$ may be less than T. The set of the cloud centers may comprise a cloud code. A satellite code corresponding to cloud center $U^n$, denoted by $S(U^n)$, may comprise a subset of $\phi_T(U_1) \times \phi_T(U_2) \times \ldots \times \phi_T(U_n)$. For example, in one embodiment, a codeword $(X_1, \ldots, X_n)$ of $S(U^n)$ may satisfy that the row space of $X_i$ is $U_i$.

In various embodiments, a source node may map the message for transmission using a Sumas code, for example, in two steps: i) map the first part of the message to a cloud center; and ii) pick the satellite code corresponding to the cloud center in the first step, and map the second part of the message to a codeword of the satellite code.

In various embodiments, for example, let $(X_1, \ldots, X_n)$ be a codeword of a satellite code. The M columns of $X_i$ may be treated as M data packets, and $X_i$ may be regarded as a batch of packets. The source node may transmit the codeword, for example, by transmitting $X_i$ one by one, and for each $X_i$ the source node may transmit its M columns as M data packets. Linear network coding may be allowed during the network transmission of these packets. For example, in one embodiment, an intermediate network node may generate and transmit new data packet by linear combination of the data packets it receives. In one embodiment, only packets of a same batch may be combined together.

Subspace Decoding

In various embodiments, let $Y_1, \ldots, Y_n$ be the received matrices corresponding to the input $X_1, \ldots, X_n$, respectively. The received matrix and the input may be related by $Y_i = X_i H_i$, where the network transfer matrix $H_i$ may be unknown in both the source node and the destination node. The decoding of a Sumas code may comprise two steps. For example, in one embodiment, the row spaces of $Y_1, \ldots, Y_n$ may be first used to decode the cloud code. After the cloud code is decoded, the cloud center in the first step of encoding may become known. For example, in one embodiment, let $U^n$ be the cloud center recovered. Then, to decode the satellite code, a codeword $(B_1, \ldots, B_n)$ may be identified in the satellite code $S(U^n)$ such that the column space of $Y_i$ may comprise a subset of the column space of $B_i$ for i=1, ..., n. In various embodiments, if more than one such codeword exist, an error may occur.

Some Advantages of Sumas Codes

In various embodiments, the maximum achievable rate of Sumas codes under the subspace decoding rule may be at least $$\max_{P_X}(I(\langle X^T \rangle; \langle Y^T \rangle) + J(rk(X); rk(Y))),$$

where $I(\langle X^T \rangle; \langle Y^T \rangle)$ may be the mutual information between the row spaces of the input and the output, $$J(rk(X); rk(Y)) = \sum_{r,s} p_{rk(X)rk(Y)}(r, s) \log \left( \prod_{i=0}^{s-1} \frac{q^T - q^i}{q^r - q^i} \right).$$

1. The maximum achievable rate of Sumas codes under the subspace decoding rule may be larger than the maximum achievable rate of subspace coding $$\max_{P_X} I(rk(X); rk(Y)) + J(rk(X); rk(Y)),$$

since $I(\langle X^T \rangle; \langle Y^T \rangle) \geq I(rk(X); rk(Y))$.
2. The decoding of a satellite code may be simple, involving only the check of inclusive relation of subspaces.
3. The cloud code and the set of satellite codes may be designed separately.

Rank-Matrix Superposition Codes

In various embodiments, an n-block rank-matrix superposition (Ramas) code with respect to $\{U(r), r=1, \ldots, \min\{T, M\}\}$ may contain a cloud code $R \subset [0, \min\{T, M\}]^n$ and a set of satellite codes, each of which may correspond to a codeword in the cloud code. The satellite code corresponding to $r^n=(r_1, \ldots, r_n) \in R$, denoted by $S(r^n)$, may comprise a subset of $\phi_T(U(r_1)) \times \ldots \times \phi_T(U(r_n))$.

In various embodiments, the encoding and the transmission of a Ramas code may be similar to those steps of a Sumas code. The decoding of a Ramas code may be different. For example, in one embodiment, let $Y_1, \ldots, Y_n$ be the received matrices. First, the ranks of $Y_1, \ldots, Y_n$ may be used to decode the cloud code. After the cloud code is decoded, the cloud center in the first step of encoding may become known. For example, in one embodiment, let $r^n$ be the cloud center recovered. Then, to decode the satellite code, a codeword $(B_1, \ldots, B_n)$ may be identified in the satellite code $S(r^n)$ such that the column space of $Y_i$ may comprise a subset of the column space of $B_i$ for i=1, ..., n. In various embodiments, if more than one such codeword exist, an error may occur.

In various embodiments, the maximum achievable rate of Ramas code under the subspace decoding rule may be at least $$\max_{P_{\langle X^T \rangle}} (I(rk(X); rk(Y)) + J(rk(X); rk(Y)))$$

where $I(rk(X); rk(Y))$ may be the mutual information between the rank of X and the rank of Y, and the maximization may be over the distribution of row space of X.

In various embodiments, the performance of a Ramas may be related to $\{U(r), r=1, \ldots, \min\{T,M\}\}$. A set of $U(r)$ may be found by solving an optimization problem. For given distribution of the transfer matrix H, $I(rk(X);rk(Y))+J(rk(X);rk(Y))$ may be a function of the distribution of the row space of X. There may exist an optimal distribution of the row space of X such that for each rank r, only matrix of row space $U(r)$ may have nonzero probability masses.

In various embodiments, the apparatus, systems, and methods described herein may operate to encode a first part of a message into an index which represents a cloud center, and to encode a second part of the message to a sequence of matrices such that at least one of row spaces or ranks of the matrices is determined by the index.

In various embodiments, a network transmission encoding scheme may comprise: encoding a part of a message to an index; and encoding another part of the message to a sequence of matrices, where subspaces spanned by the rows (columns) of the matrices in the sequence may be determined by the index.

In various embodiments, a network transmission encoding scheme may comprise: encoding a part of a message to an index; and encoding another part of the message to a sequence of matrices, where ranks of matrices in the sequence may be determined by the index.

In various embodiments, a method for processing packets in a communication network may comprise: putting the packets into matrix form; using the subspaces spanned by the rows (columns) of the matrices to recover an index which can be mapped to the first part of the message; and using the index and the subspaces spanned by the columns (rows) of the matrices to recover the second part of the message.

In various embodiments, a method for processing packets in a communication network comprising: putting the packets into matrix form; using the ranks of the matrices to recover an index which can be mapped to the first part of the message; and using the index and the subspaces spanned by the columns (rows) of the matrices to recover the second part of the message. Yet other embodiments are possible. More detailed explanations of the superposition coding for network communication according to various embodiments, such as for linear operator channels over finite fields, are provided below, for example, with respect to FIGS. 1-9.

Introduction

In various embodiments, a coding approach based on the superposition structure may be used for linear operator channels. Under a subspace decoding rule, a lower bound on the maximum achievable rate of the coding approach according to various embodiments may be used. For general linear operator channels, the coding approach according various embodiments may achieve higher rates than the subspace coding approach proposed by Koetter and Kschischang.

In various embodiments, for example, a finite field F with q elements may be fixed. A linear operator channel (LOC) with input random variable $X \in F^{T \times M}$ and output random variable $X \in F^{T \times N}$ may be given by $$Y = XH, \quad (1)$$

Where H, called the transfer matrix, may comprise a random variable over $F^{M \times N}$. It may be assumed that the transfer matrices in different channel uses may be independent and follow the same distribution, and X and H may be independent. It may be also assumed that the distribution of H may be given a priori to both a transmitter and a receiver, but the instances of H may not become known by either the transmitter or the receiver. An LOC may model the communication through a network employing linear network coding. For example, the coding problems of the noncoherent transmission of LOCs with an arbitrary distribution of H are discussed below.

Existing works on coding for LOCs are mostly in the framework of subspace coding proposed by Koetter and Kschischang. In various embodiments, the vector space spanned by the row vectors and column vectors of a matrix may comprise a row space and a column space of the matrix, respectively. Koetter and Kschischang observe that in an LOC, the column space of Y may always be a subspace of the column space of X. They propose using the column subspaces for encoding and decoding and discuss coding schemes for one use of an LOC. The coding schemes using the column subspaces for encoding and decoding are known as (KK) subspace coding. Subspace coding has generated a lot of research interests and the study of subspace coding may also be extended from one use to multiple uses of a LOC.

In various embodiments, for example, when $T \geq M$, part of X may be used to transmit an identity matrix so that the receiver may recover the instances of H. This approach, called channel training, may be regarded as a special realization of KK subspace coding, and may be used. Channel training may achieve at least (1−M/T) fraction of the capacity of the LOC so that it may become efficient when T is much larger than M.

In various embodiments, a channel training scheme with low encoding/decoding complexity may be used, for example, by generalizing fountain codes.

In various embodiments, for example, when T is close to M, for which channel training becomes less efficient or impossible, good codes may become unknown for general LOCs. Further, the maximum achievable rate of KK subspace coding may be in general strictly less than the capacity of the LOC. Coding schemes for LOCs, according to various embodiments, may be used to go beyond the framework of KK subspace coding and achieve higher rates than KK subspace coding may do. The discussion hereafter may be for general values of T, M, N and q unless otherwise specified.

Coding approaches for LOCs, according to various embodiments, may be based on the observation that the row spaces of X and Y may also be used to transmit information. In various embodiments, a code using this approach may include a set of cloud centers and a set of satellite codes, each of which may correspond to a cloud center. A cloud center may comprise a sequence of subspaces, and the corresponding satellite code may comprise a set of sequences of matrices whose row spaces may form a sequence identical to the cloud center. In various embodiments, during the encoding, part of the message may be first encoded to a cloud center. The rest of the message may be encoded to a codeword of the corresponding satellite code. For example, due to the similarity to the superposition coding for broadcast channels, this approach may be called subspace-matrix superposition (Sumas) coding.

More detailed explanations with respect to achievable rates of Sumas codes under a subspace decoding rule are discussed below. For example, in various embodiments, the cloud center may be first recovered using the row spaces of the received matrices, which may identify which satellite code is used in encoding. Further, the corresponding satellite code may be decoded using the column spaces of the received matrices by only checking the inclusion relationship between subspaces. For example, under the subspace coding rule, a lower bound on the maximum achievable rate of the Sumas codes may be obtained. In various embodiments, the lower bound may be higher than the maximum achievable rate of KK subspace codes.

Also, more detailed explanations with respect to a class of Sumas codes called rank-matrix superposition (Ramas) codes are provided below. In various embodiments, a cloud center for Ramas codes may comprise a sequence of integers specifying the ranks of the matrices forming a codeword of the corresponding satellite code. In various embodiments, Ramas codes may achieve the maximum achievable rate of KK subspace codes under a modified subspace decoding rule. For example, in various embodiments, the maximum achievable rate of KK subspace codes may be the sum of two parts: one part may be achieved by coding using only input and output ranks, and the other part may have an interpretation using set packing. Under the modified subspace decoding rule, for example, the achievable rates of the cloud centers and the satellite codes may exactly correspond to these two parts, respectively.

Preliminaries

In various embodiments, for example, for a matrix X, let rk(X) be its rank, let $X^T$ be its transpose, and let $\langle X \rangle$ be the subspace spanned by the column vectors of X. In such a scenario, $\langle X \rangle$ and $\langle X^T \rangle$ may comprise the column space and the row space of X, respectively.

In various embodiments, the vectors in $F^r$ may be regarded as column vectors. The projective space $Pj(F^r)$ may comprise the collection of all subspaces of $F^r$. For example, in various embodiments, let $Pj(m, F^r)$ be the subset of $Pj(F^r)$ that may contain all the subspaces with dimension less than or equal to m. Let $Fr(F^{m \times r})$ be the set of full rank matrices in $F^{m \times r}$. Then, it may be defined that:

$$\chi_r^m = \begin{cases} (q^m - 1)(q^m - q) \dots (q^m - q^{r-1}) & r > 0 \\ 1 & r = 0 \end{cases} \quad (2)$$

For $1 \leq r \leq m$, it may be counted that $|Fr(F^{m \times r})| = \chi_r^m$ as follows. A full rank m×r matrix may be obtained by picking its r columns from $F^m$, for example, one by one. The first column has $q^m - 1$ choices, and the ith column, $1 < i \leq r$, may not be picked in the subspaces spanned by the first i−1 columns, and hence may have $q^m - q^{i-1}$ choices. The Gaussian binomial $$\begin{bmatrix} m \\ r \end{bmatrix} \triangleq \frac{\chi_r^m}{\chi_r^r}$$

may comprise the number of r-dimensional subspaces of $F^m$.

LOCs from Two Points of View

More detailed explanations with respect to the properties of LOCs, for example, from two different perspectives, according to various embodiments, are provided below. The first perspective will be taken from a linear combination viewpoint, and the second perspective will be taken from a linear operation viewpoint.

A Linear Combination Viewpoint

In various embodiments, for example, for an LOC given in (1), the column space of Y may always be a subspace of the column spaces of X, i.e., $\langle Y \rangle \subset \langle X \rangle$. This point of view was first employed by Koetter and Kschischang in their approach for random linear network coding, in which they define a channel with subspaces as input and output and discuss the coding problem for this subspace channel.

In various embodiments, the coding schemes of LOCs using the column subspaces for encoding and decoding may comprise KK subspace coding. An n-block KK subspace code may comprise a subset of $(Pj(\min\{T, M\}, F^T))^n$. To apply a KK subspace code in an LOC, the subspaces in a codeword may be converted to matrices. For $U \in Pj(\min\{T, M\}, F^T)$, this conversion can be done by a transition probability $P_{X|\langle X \rangle}(\cdot|U)$. Given a transition matrix $P_{X|\langle X \rangle}$, a new channel with input $\langle X \rangle$ and output $\langle Y \rangle$ may be defined such that the KK subspace code actually may be applied thereto.

In various embodiments, it may be defined that definition 1 (Subspace Degradation): for an LOC in (1), given a transition probability $P_{X|\langle X \rangle}$, a new channel with input $\langle X \rangle$, output $\langle Y \rangle$, and the channel law $$P_{\langle Y \rangle|\langle X \rangle}(V|U) = \sum_X Pr\{\langle XH \rangle = V\} P_{X|\langle X \rangle}(X|U).$$

This channel may be referred to as the subspace degradation of the LOC with respect to $P_{X|\langle X \rangle}$.

In various embodiments, when using column subspaces for encoding and decoding, the maximum achievable rate of a memoryless LOC may be calculated as:

$$C_{SS} \triangleq \max_{px} I(\langle X \rangle; \langle Y \rangle).$$

Existing works have not given a clear answer about how to achieve $C_{ss}$.

A Linear Operation Viewpoint

In various embodiments, for example, for an LOC given in (1), the transpose of the transfer matrix $H^T$ may comprise a (random) linear operator that may map a vector in $F^M$ to a vector in $F^N$. $H^T$ may induce a linear operator on subspaces of $F^M$, for example, given by $$H^T U \triangleq \{H^T x : x \in U\}.$$

This operation may provide a new channel with input $\langle X^T \rangle$ and output $\langle Y^T \rangle$.

In various embodiments, under definition 2 (Subspace Core): an LOC in (1) may induce a new channel with input $\langle X^T \rangle$, output $\langle Y^T \rangle$, and the channel law $$P_{\langle Y^T \rangle|\langle X^T \rangle}(V|U) = Pr\{H^T U = V\}.$$

This channel may comprise, for example, a subspace core of the LOC.

In various embodiments, the subspace core of an LOC may be unique, and its transition matrix may be expressed more explicitly as $$P_{\langle Y^T \rangle|\langle X^T \rangle}(V|U) = Pr\{\langle H^T D^T \rangle = V\},$$

where D may be any full rank M×dim(U) matrix with $\langle D \rangle = U$. An LOC may be symmetric for all input matrices that may span the same row space.

In various embodiments, under definition 3: a PMF p over $F^{T \times M}$ may comprise α-type if $p(X) = p(X')$ for all X, $X' \in F^{T \times M}$ with $\langle X^T \rangle = \langle X'^T \rangle X'$. In other words, an α-type distribution may be uniform for a given row space.

In various embodiments, it may be shown that there may exist an α-type input distribution that may maximize $I(X;Y)$ for any LOC, i.e., $$C \triangleq \max_{px} I(X; Y) = \max_{px: \alpha-type} I(X; Y).$$

It may also be shown that $$C_{SS} = \max_{px: \alpha-type} I(\langle X \rangle : \langle Y \rangle), \quad (3)$$

and for an α-type input distribution $$I(\langle X \rangle; \langle Y \rangle) = J(rk(X); rk(Y)) + I(rk(X); rk(Y)), \quad (4)$$

where $$J(rk(X); rk(Y)) \triangleq \sum_{x < r} p_{rk(X)rk(Y)}(r, s) \log \frac{\chi_s^T}{\chi_s^r}. \quad (5)$$

Existing works on coding for LOCs are most in the framework of KK subspace coding. In the next section, more detailed explanations are provided below with respect to different coding approaches that may combine the using of subspace degradations and the subspace core of an LOC, according to various embodiments.

Subspace-Matrix Superposition Code

In various embodiments, for example, let $x^n$ be a vector of n components, where the ith component may be $x_i$. For $U \in Pj(\min\{T, M\}, F^M)$ let $$\phi_T(U) \triangleq \{X \in F^{T \times M} : \langle X^T \rangle = U\},$$

i.e., $\phi_T(U)$ may be the set of all input matrices with row space U.

In various embodiments, under definition 4: an n-block subspace-matrix superposition (Sumas) code may contain a set of cloud centers and a set of satellite codes, each of which may correspond to a cloud center. The set of cloud centers u, which may be also called a cloud code, may be a subset of $(Pj(\min\{T, M\}, F^M))^n$. The satellite code corresponding to $U^n \in u$ may be a subset of $\phi_T(U_1) \times \ldots \times \phi_T(U_n)$, and may be denoted by $S(U^n)$.

In various embodiments, the encoding of a Sumas code may comprise two steps, for example, i) mapping the first part of the message to a cloud center, and second, ii) picking the satellite code corresponding to the cloud center in the first step, and then mapping the second part of the message to a codeword of the satellite code.

In various embodiments, for example, when $T \geq M$ and there exists only one cloud center $(F^M)^n$, the unique satellite code may be a subset of $(Fr(F^{T \times M}))^n$. This may be a Sumas code with a trivial cloud code, and all the transmitted matrices may be associated with a full rank. In one embodiment, the codes constructed using channel training may have this structure.

In other embodiments, for example, all the satellite codes may have cardinality one. Only the cloud code may be used to transmit information. The maximum achievable rate of this kind of codes may be $\max_{px} I(\langle X^T \rangle; Y)$, when using the received matrices to decode.

In various embodiments, the decoding of a Sumas code may comprise two inverse steps. For example, first, the cloud code may be decoded using the received matrices, and the transmitted cloud center may be recovered. The recovered cloud center may allow identifying which satellite code is used in encoding. Then, the corresponding satellite code may be decoded. The achievable rates of the cloud code and the satellite codes may be characterized from a broadcast channel perspective.

In various embodiments, Sumas codes may be regarded as codes for a broadcast channel with input X and output $Y_1 = Y$ and $Y_2 = Y$, where X and Y may be related by (1). For example, in one embodiment, let $R_1$ be the rate for output $Y_1$ and $R_2$ be the rate for output $Y_2$. This may comprise a degraded broadcast channel, and any rate pair $(R_1, R_2)$ such that for some Px $$R_1 \leq I(X; Y | \langle X^T \rangle)$$

$$R_2 \leq I(\langle X^T \rangle; Y)$$

may be achievable by Sumas codes (where $R_1$ may be achieved by the satellite codes, and $R_2$ may be achieved by the cloud code). Since, in various embodiments, $$I(X; Y | \langle X^T \rangle) + I(\langle X^T \rangle; Y) = I(X; Y),$$

Sumas codes may achieve the capacity of the LOC.

In various embodiments, the above discussion about the achievable rates is just for the sake of introducing the coding structure. In other embodiments, when the discussion is not limited to any decoding rules, jointly typical decoding may be assumed. More detailed explanations are provided below with respect to the property of Sumas codes under other decoding rules that may have simple decoding algorithms, according to various embodiments.

Sumas Code Subspace Decoding

In various embodiments, for example, under definition 5 (Subspace Decoding Rule): let $Y_1, \ldots, Y_n$ be the received matrices. First, $(\langle Y_1^T \rangle, \ldots, \langle Y_n^T \rangle)$, may be used to decode the cloud code. After the cloud code is decoded, the cloud center in the first step of encoding may become known, and hence the satellite code used in encoding. Let $\hat{U}^n$ may be the cloud center recovered. For example, to decode the satellite code, a codeword $(X_1, \ldots, X_n)$ in $S(\hat{U}^n)$ satisfying $\langle Y_i \rangle \subset \langle B_i \rangle$ for $i = 1, \ldots, n$ may be identified. For example, if more than one such codeword is identified, an error may occur.

In various embodiments, in the subspace decoding rule, only the row spaces and the column spaces of the received matrices may be used. The decoding of satellite codes may be more specific since, for example, only the inclusion relationship between subspaces may be checked in various embodiments.

In various embodiments, under theorem 1: the maximum achievable rate of Sumas codes under the subspace decoding rule may be at least $$\max_{p(x^T)} [J(rk(X), rk(Y)) + I(\langle X^T \rangle; \langle Y^T \rangle)],$$

where J may be defined in (5). As a function of $p\langle_X^T \rangle$, $J(rk(X); rk(Y)) + I(\langle X^T \rangle; \langle Y^T \rangle)$ may be concave.

In various embodiments, the proof of the above theorem may be postponed to the next subsection. For example, in one embodiment, since $I(\langle X^T \rangle; \langle Y^T \rangle) \geq I(rk(X); rk(Y))$, together with (3) and (4), it may be seen that Sumas codes under the subspace decoding rule may potentially achieve higher rates than KK subspace coding.

Sumas Code Rates

In various embodiments, the achievable rates of Sumas codes under the subspace decoding rule may be evaluated.

In various embodiments, for example, under lemma 2, let X be the uniform random variable with support $\phi_T(U)$ for $U \in Pj(\min\{M, T\}, F^M)$. For $V \in Pj(\dim(U), F^T)$, $$Pr\{\langle X \rangle \supset V\} = \frac{\chi_{\dim(V)}^{\dim(U)}}{\chi_{\dim(V)}^T}.$$

In various embodiments, under proof: let $r = \dim(U)$ and $s = \dim(V)$. It may be first shown that $|\phi_T(U)| = \chi_r^T$, where the RHS may be defined in (2). For example, in one embodiment, $D \in Fr(F^{r \times M})$ may be fixed with $\langle D^T \rangle = U$. It may be rewritten as $$\phi_T(U) = \{BD; B \in Fr(F^{T \times r})\}. \quad (6)$$

So $|\phi_T(U)| = |Fr(F^{T \times r})| = \chi_r^T$.

In various embodiments, the distribution of $\langle X \rangle$ may be checked. For $V' \in Gr(r, F^T)$, $$\phi_T(U | V') \overset{\Delta}{=} \{X \in F^{T \times M} : \langle X \rangle = V', \langle X^T \rangle = U\} \quad (7)$$

$$= \{BD : B \in Fr(F^{T \times r}), \langle B \rangle = V'\}$$

$$= \{BD : B^T \in \phi_r(V')\}.$$

where (7) may be obtained similar to (6). The sets $\phi_T(U|V')$, $V' \in Gr(r, F^T)$, may provide a partition of $\phi_T(U)$, and all have the same cardinality $\chi_r^r$. Thus, in various embodiments, $\langle X^T \rangle$ may have a uniform distribution over $Gr(r, F^T)$.

In various embodiments, it may be reasoned that $$|\{V' \in Gr(r, F^T) : V \subset V'\}| = \begin{bmatrix} T - s \\ r - s \end{bmatrix}. \quad (8)$$

Then $$Pr\{\langle X \rangle \supset V\} = \frac{\begin{bmatrix} T - s \\ r - s \end{bmatrix}}{|Gr(r, F^T)|} = \frac{\begin{bmatrix} T \\ r \end{bmatrix} \frac{\chi_s^r}{\chi_s^T}}{\begin{bmatrix} T \\ r \end{bmatrix}} = \frac{\chi_s^r}{\chi_s^T}.$$

In various embodiments, the formula (8) may be verified as follows. A complementary $\hat{V}$ of V may be fixed such that $V \oplus \tilde{V} = F^T$ and $V \cap \tilde{V} = \{0\}$. For any $V' \in Gr(r, F^T)$ with $V \subset V'$, a unique direct sum decomposition $V' = V \oplus \tilde{V}$ may be obtained such that $\tilde{V}$ is a subspace of $\tilde{V}$. Since such $V'$ and $\tilde{V}$ may be, for example, one-to-one correspondent, the problem may become to count the number of $(r-s)$-dimensional subspaces of the $(T-s)$-dimensional subspace $\tilde{V}$. For example, by Gaussian binomials, the number may be $$\begin{bmatrix} T-s \\ r-s \end{bmatrix}.$$

In various embodiments, the following sets of typical sequences may be defined according to various embodiments. For example, in one embodiment, the number of occurrences of $\alpha$ in $x^n$ may be denoted as $N(a|x^n)$. For a random variable A with support $\mathcal{A}$, let $T_{[A]\delta}^n$ be the set of all $p_A$-typical sequence $x^n$ with constant $\delta$, i.e., $$\left| \frac{N(a|x^n)}{n} - p_A(a) \right| \leq \delta \forall a \in \mathcal{A}.$$

In various embodiments, further, for a random variable B with support $\beta$ and a transition matrix $P_{B|A}$, let $T_{[B|A]\delta}^n(x^n)$ be the set of $P_{B|A}$ typical sequences $y^n$ under the condition of $x^n \in (\mathcal{A})^n$ with constant $\delta$, i.e., $$\left| \frac{N(a,b|x^n, y^n)}{n} - \frac{N(a|x^n)}{n} P_{B|A}(b|a) \right| \leq \delta \forall a \in \mathcal{A}, b \in \mathcal{B}.$$

For example, in various embodiments, the delta-convention may be applied so that the constant $\delta$ may be omitted from the notation.

In various embodiments, under lemma 3: a satellite code $S(U^n)$ may be considered with $U^n \in T_{[\langle X^T \rangle]}^n$. For example, in one embodiment, when using only column spaces of the received matrices for decoding, the maximum achievable rate of the satellite code may be at least $J(rk(X);rk(Y))$.

In various embodiments, under Proof: the achievable rates of satellite codes may be calculated using a random coding scheme. For example, in one embodiment, the code book size may be $2^{nR}$. For codeword $(X_1, \ldots, X_n)$, $X_i$ may be independently, uniformly at random picked in $\phi_T(U_i)$. The satellite code $S(U^n)$ may be constructed randomly, for example, by generating $2^{nR}$ codewords independently.

In various embodiments, let $X^n \in S(U^n)$ be the codeword transmitted and $Y^n$ be the received sequence of matrices, then there may exist a sequence $\epsilon_{n \to 0}$ such that $$Pr\{rk(Y^n) \in T_{[rk(Y)|\langle X^T \rangle]}^n(U^n)\} \geq 1 - \epsilon_n \quad (9)$$

Here $rk(Y^n) \triangleq (rk(Y_1), \ldots, rk(Y_n))$. Similarly, in one example, $dim(U^n) = (dim(U_1), \ldots, dim(U_n))$ may be used.

In various embodiments, for $Y^n$ with $$N(r, s | dim(U^n), rk(Y^n)) = \sum_{V: dim(V)=r} N(V, s | U^n, rk(Y^n))$$

$$\geq \sum_{V: dim(V)=r} n\left( P_{rk(Y)|\langle X^T \rangle}(s|V) \frac{N(V|U^n)}{n} - \delta_n \right) \quad (10)$$

$$\geq \sum_{V: dim(V)=r} n\left( P_{rk(Y)|\langle X^T \rangle}(s|V) p_{\langle X^T \rangle}(V) - \delta_n' \right) \quad (11)$$

$$= n(p_{rk(X)rk(Y)}(r,s) - \delta_n'')$$

$$rk(Y^n) \in T_{[rk(Y)|\langle X^T \rangle]}^n(U^n),$$

where (10) and (11) may follow from $rk(Y^n) \in T_{[rk(Y)|\langle X^T \rangle]}^n(U^n)$ and $U^n \in T_{[\langle X^T \rangle]}^n$, respectively; and $\delta_n'' \to 0$.

In various embodiments, let $\tilde{X}^n$ be a codeword not the same as $X^n$. For $Y^n$ with $rk(Y^n) \in T_{[rk(Y)|\langle X^T \rangle]}^n(U^n)$, $$Pr\{\langle \tilde{X}_i \rangle \supset \langle Y_i \rangle, \forall i\} = \prod_{i=1}^n Pr\{\langle \tilde{X}_i \rangle \supset \langle Y_i \rangle\} \quad (12)$$

$$= \prod_{i=1}^n \frac{\chi_{rk(Y_i)}^{dim(U_i)}}{\chi_{rk(Y_i)}^T}$$

$$= \prod_{r,s} \left( \frac{\chi_s^r}{\chi_s^T} \right)^{N(r,s|dim(U^n),rk(Y^n))}$$

$$\leq \prod_{r,s} \left( \frac{\chi_s^r}{\chi_s^T} \right)^{n(p_{rk(X)rk(Y)}(r,s) - \delta_n'')}, \quad (13)$$

where (12) may follow from lemma 2.

In various embodiments, the probability of decoding error using the decoding method described for satellite codes may be $$Pr\{\exists \tilde{X}^n \neq X^n \text{ s.t.} \langle \tilde{X}_i \rangle \supset \langle Y_i \rangle, \forall i\} = \sum_{Y^n} Pr\{\exists \tilde{X}^n \neq X^n \text{ s.t.} \langle \tilde{X}_i \rangle \supset \langle Y_i \rangle, \forall i\} p_{Y^n}(Y^n) \quad (14)$$

$$< \sum_{\tilde{X}^n \neq X^n} \sum_{Y^n \in T_{[rk(Y)|\langle X^T \rangle]}^n(U^n)} Pr\{\langle \tilde{X}_i \rangle \supset \langle Y_i \rangle, \forall i\} p_Y^n(Y^n) + \quad (15)$$

$$\sum_{Y^n \notin T_{[rk(Y)|\langle X^T \rangle]}^n(U^n)} p_{Y^n}(Y^n)$$

$$\leq 2^{nR} \prod_{r,s} \left( \frac{\chi_s^r}{\chi_s^T} \right)^{n(p_{rk(X)rk(Y)}(r,s) - \delta_n'')} + \epsilon_n \quad (16)$$

$$\leq 2^{n(R - J(rk(X), rk(Y)) + \delta_n''')}$$

where (14) may follow that $Y^n$ and $\tilde{X}^n$ may be independent when $\tilde{X}^n \neq X^n$; (15) may follow from the union bound; and (16) may follows from (9) and (13). Then, for example, following the typical random coding argument, $J(rk(X),rk(Y))$ may be achieved by the satellite codes.

In various embodiments, under proof of theorem 1: the cloud code of a Sumas code may be used for the subspace core of an LOC. By the achievability of Channel Coding Theorem, for every distribution of $\langle X^T \rangle$, there may exist a sequence of cloud codes $u \subset T_{[\langle X^T \rangle]}^n$ achieving the rate $I(\langle X^T \rangle;\langle Y^T \rangle)$. In various embodiments, under lemma 3, the maximum achievable rate of the satellite codes may be at least $J(rk(X),rk(Y))$. So, the first part of the theorem may be proved.

In various embodiments, for example, by writing $$p_{rk(X)rk(Y)}(r,s) = \sum_U P_{rk(Y)|\langle X^T \rangle}(s|U) p_{\langle X^T \rangle}(U), \qquad (17)$$

it may be that $J(rk(X),rk(Y))$ may be a linear function of $p(_x^T)$. Together with the case that $I(\langle X^T \rangle;\langle Y^T \rangle)$ may be a concave function of $p\langle _x^T \rangle$ the proof may be completed.

Rank-Matrix Superposition Codes

In various embodiments, it may be shown that the achievable rates of KK subspace coding may be separated into two parts, for example, as shown in (4): one part ($I(rk(X);rk(Y))$) may be the achievable rate using the ranks of input and output matrices, and other part ($J(rk(X);rk(Y))$) may have an interpretation using set packing. In various embodiments, a special class of Sumas codes may be introduced such that these parts of the achievable rates of KK subspace coding may be achieved, for example, by the cloud codes and the satellite codes, respectively.

In various embodiments, for $r=0, 1, \ldots, \min\{M,T\}$, let $U(r)$ be an r-dimensional subspace of $F^M$. An n-block rank-matrix superposition (Ramas) code with respect to $\{U(r)\}$ may be an n-block Sumas code with the cloud code being a subset of $\{U(r)\}^n$. The set $\{0, 1, \ldots, m\}$ may be denoted by $[m]$.

Alternatively and/or in addition, a Ramas code may be defined as follows. For example, in various embodiments, under definition 6: an n-block rank-matrix superposition (Ramas) code with respect to $\{U(r)\}$ may contain a cloud code $\mathcal{R} \subset [\min\{T, M\}]^n$ and a set of satellite codes, each of which may correspond to a codeword in the cloud code. The satellite code corresponding to $r^n \in \mathcal{R}$, denoted by $S(r^n)$, may be a subset of $\phi_T(U(r_1)) \times \ldots \times \phi_T(U(r_n))$.

In various embodiments, it is noted that $\{U(r)\}$ in the above definition may be a subset of $Pj(\min\{T, M\}, F^M)$ with all the elements having different ranks. The encoding of the cloud code may be equivalent to mapping the message to the ranks of the input matrices. The constraints on the satellite codes given by $\{U(r)\}$ may make Ramas codes different from the existing designs of KK subspace codes.

In various embodiments, the performance of Ramas codes may be shown under the following decoding rule. For example, under definition 7 (Rank-Subspace Decoding Rule): let $Y_1, \ldots, X_n$ be the received matrices. First, $(rk(Y_1), \ldots, rk(Y_n))$ may be used to decode the cloud code. After the cloud code is decoded, the cloud center in the first step of encoding, and hence the satellite code used in encoding, may become known. Let $\hat{r}^n$ be the cloud center recovered. Then, for example, to decode the satellite code, a codeword $(B_1, \ldots, B_n)$ may be identified in $S(\hat{r}^n)$ such that $\langle Y_i \rangle \subset \langle B_i \rangle$ for $i=1, \ldots, n$. If there exists more than one such codeword, an error may occur.

In various embodiments, under theorem 4: the maximum achievable rates of Ramas codes under the rank-subspace decoding rule may be at least $$C_{SS} = \max_{P_{\langle x^T \rangle}} [J(rk(X); rk(Y)) + I(rk(X); rk(Y))]. \qquad (18)$$

In various embodiments, under sketch of proof: the equality in (18) may be obtained, for example, by rewriting (3) using (4). For given $p_{rk(x)}$, $J(rk(X);rk(Y))+I(rk(X);rk(Y))$ may be a convex function of $P\langle _x^T \rangle_{|rk(X)}$. By the properties of convexity, there may exist a $p\langle _x^T \rangle$ that may maximize $J(rk(X);rk(Y))+I(rk(X);rk(Y))$ such that for any r, there may exist an r-dimensional subspace U of $F^M$ such that $P\langle _x^T \rangle_{|(X)}(U|r)=1$.

In various embodiments, this distribution $p\langle _x^T \rangle$ may be fixed. For example, in one embodiment, there may exist a sequence of cloud codes $\mathcal{R} \subset T_{[rk(X)]}^n$ achieving $I(rk(X);rk(Y))$. For example, under lemma 3, $J(rk(X);rk(Y))$ may be achieved by the satellite codes.

In various embodiments, the proof of theorem 4 may provide a method to find a set $\{U(r)\}$ so that the Ramas code may achieve $C_{ss}$, for example, by solving the maximization problem in (18).

Systems, Apparatus, Methods and Machine-Readable Media

Figure 5:
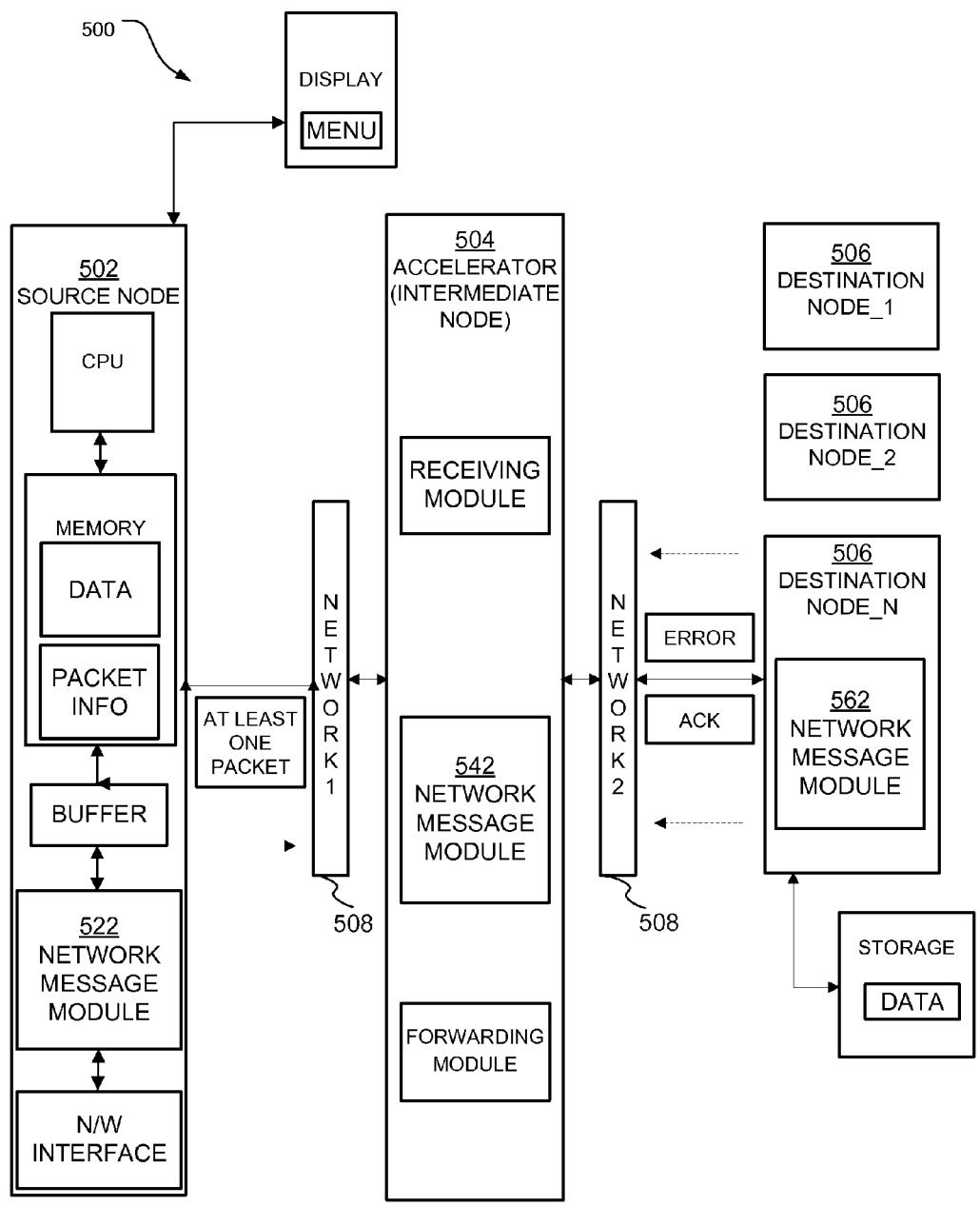
FIG. 5 shows a block diagram of a system, including apparatuses, employing the subspace-matrix (rank-matrix) superposition coding scheme, according to various embodiments.

FIG. 5 shows a block diagram of a network environment, including a system 500 and apparatuses 502, 504, 506, according to various embodiments. A source node 502 (e.g., transmitter) may have a message to be delivered to one of a plurality of destination nodes 506 (e.g., receiver). In various embodiments, the source node 502 and the destination nodes 506 may communicate indirectly, for example, via an accelerator 504 (e.g., an intermediate node). In one embodiment, for example, the source node 502 and the destination nodes 506 may not communicate directly with each other, but both may communicate with the accelerator 504 (e.g., the intermediate node).

In various embodiments, the source node 502 may first organizes its message into, for example, message 1 and message 2. The source node 502 may then apply one or more of the encoding methods described herein, and then may output packets generated, for example, by its network message module 522. The accelerator 504 (e.g., the intermediate node) may receive at least a portion of the packets transmitted by the source node 502, apply linear network coding, for example, for packets of the same batch, and output coded packets. The destination node 506 (e.g., the destination node$_n$) may receive at least a portion of the coded packets transmitted by the accelerator 504 (e.g., the intermediate node), and then recover the message 1 and the message 2 using one or more of the decoding methods described herein. Once the message 1 and the message 2 are recovered, then the destination node 506 (e.g., the destination node$_n$) may recover the original message using the message 1 and the message 2, for example, by concatenating them together and/or interleaving at least one portion of each of the message 1 and the message 2 and so on.

The system 500 and apparatuses 502, 504, 506 in FIG. 5 may be implemented in a machine-accessible and readable medium that is operational over one or more networks 508. The networks 508 may be wired, wireless, or a combination of wired and wireless. Also, at least one of the networks 508 may be a satellite-based communication link, such as the WINDS (Wideband InterNetworking engineering test and Demonstration Satellite) communication link or any other commercial satellite communication links. The system 500 and apparatuses 502, 504, 506, such as the network message module 522, 542, 562, may be used to implement, among other things, the processing associated with the computer-implemented methods 600, 700, 800 of FIGS. 6-8. Modules may comprise hardware, software, and firmware, or any combination of these. Additional embodiments may be realized.

Figure 6:
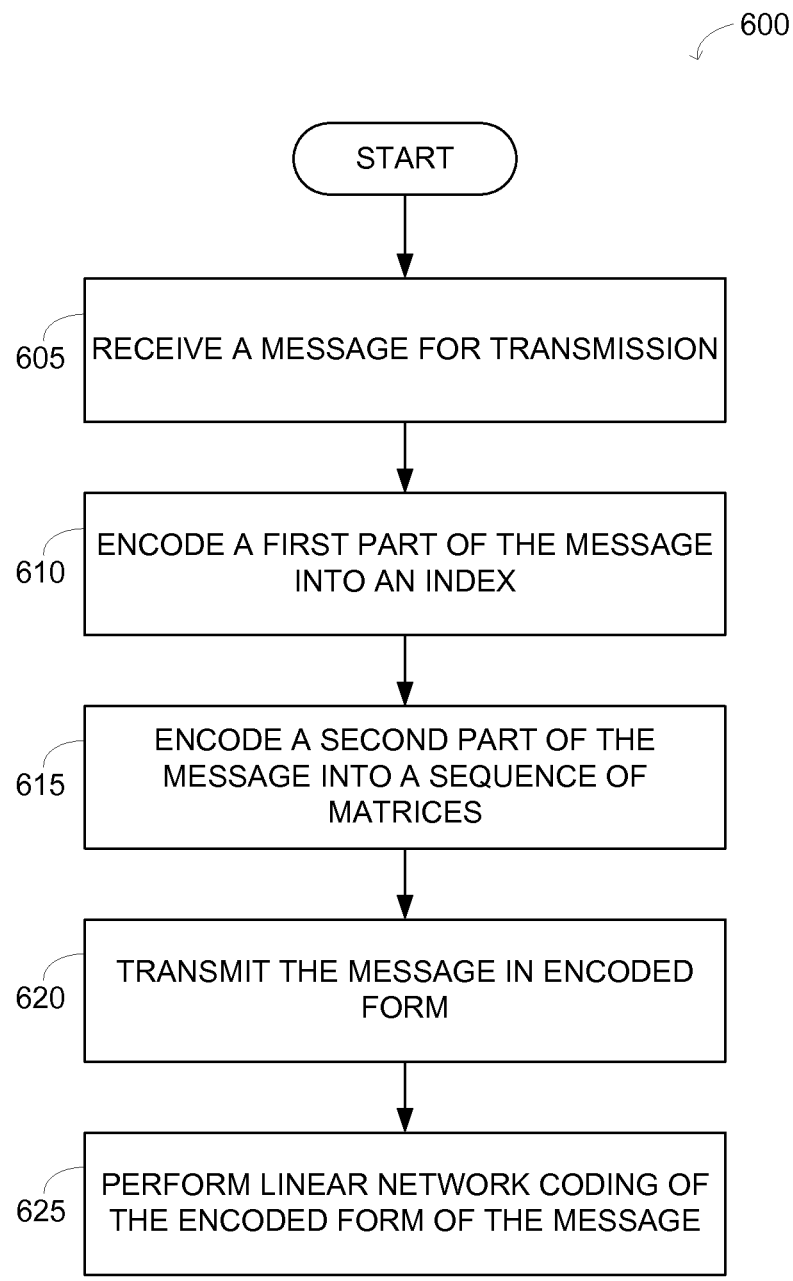
FIG. 6 shows a flow chart illustrating various methods to encode and transmit a message, according to various embodiments.

Referring to FIG. 6, some computer-implemented methods 600 according to various embodiments are provided. In various embodiment, the methods 600 may begin, at block 605, with receiving, at a transmitter (e.g., a source node 502), a message to be transmitted over a network (e.g., the network 508) to a receiver (e.g., a destination node 506). In various embodiments, at block 610, a first part of the message may be encoded, for example, into an index. In one embodiment, for example, the first part of the message may be transformed into one or more cloud centers.

In various embodiments, at block 615, a second part of the message may be encoded, for example, to a sequence of matrices such that at least one of row spaces or ranks of the matrices may be determined by the index. In one embodiment, for example, one or more satellite codes corresponding to the one or more cloud centers in the first step may be selected. Then, the second part of the message may be transformed into a codeword of the satellite code. Also, in one embodiment, for example, the row spaces of the matrices may comprise a first set of subspaces spanned by the rows of the matrices in the sequence. Similarly, in one embodiment, for example, the column spaces of the matrices may comprise a second set of subspaces spanned by the columns of the matrices in the sequence.

In various embodiments, at block 620, an encoded form of the message, such as one or more packets, may be transmitted over the network (e.g., the network 508) to the receiver (e.g., the destination node 504), for example, via an intermediate node (e.g., an accelerator 504). In various embodiments, at block 625, linear network coding may be performed with respect to the encoded form of the message, for example, by the intermediate node (e.g., the accelerator 504).

Figure 7:
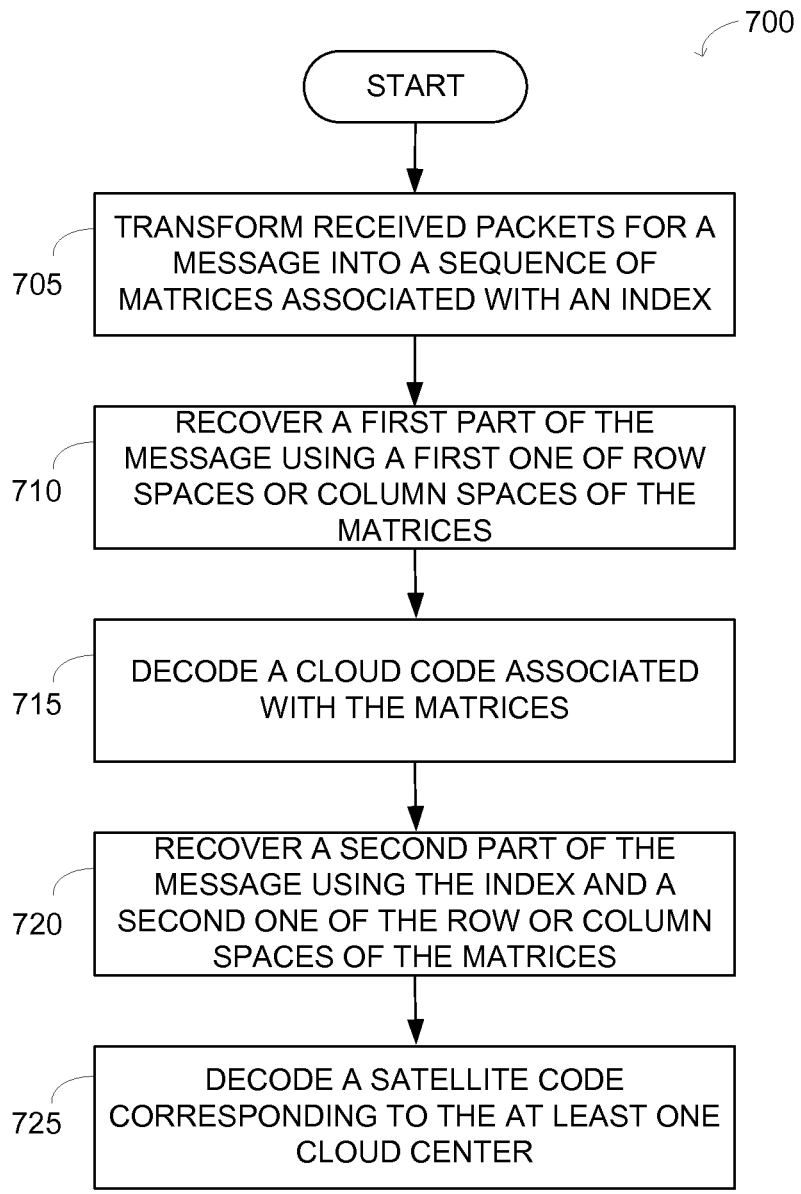
FIG. 7 shows a flow chart illustrating various methods to decode data packets, according to various embodiments.

Referring to FIG. 7, additional computer-implemented methods 700 according to various embodiments are provided. In various embodiments, the methods 700 may begin, at block 705, with transforming one or more received packets for a message into a sequence of matrices. In one embodiment, for example, the one or more packets may be transmitted from, for example, the transmitter (e.g., the source node 502) via the intermediate node (e.g., the accelerator 504).

In various embodiments, at block 710, a first part of the message may be recovered using a first one of row spaces or column spaces of the matrices. In various embodiments, at block 715, the recovering of the first part may comprise decoding a cloud code associated with the matrices to retrieve an index that may comprise one or more values indicating at least one cloud center used to encode the message, for example, by the transmitter (e.g., the source node 502). In one embodiment, for example, the row spaces of the matrices, such as $Y_1, \ldots, Y_n$, associated with the received packets may be used to retrieve the at least one cloud center (used to encode the message by the transmitter) from the cloud code associated with the matrices.

In various embodiments, at block 720, a second part of the message may be recovered using the retrieved index and a second one of the row or column spaces of the matrices. In various embodiments, at block 725, the recovering of the second part may comprise decoding a satellite code corresponding to the at least one cloud center. In various embodiments, the decoding of the satellite code may comprise identifying a codeword from the satellite code, wherein a subset of the column space of a matrix in the codeword matches the column space of one or more of the matrices.

In one embodiment, continuing with the above example, let $U''$ be the cloud center recovered, to decode the satellite code, a codeword $(B_1, \ldots, B_n)$ may be identified from the satellite code $S(U'')$, wherein the column space of $Y_i$ may be a subset of the column space of $B_i$ for $i=1, \ldots, n$.

In various embodiments, an error may be determined in the decoding of the satellite code based on identifying from the satellite code more than one codeword, wherein a subset of the column space of each identified codeword matches the column space of the matrices.

Figure 8:
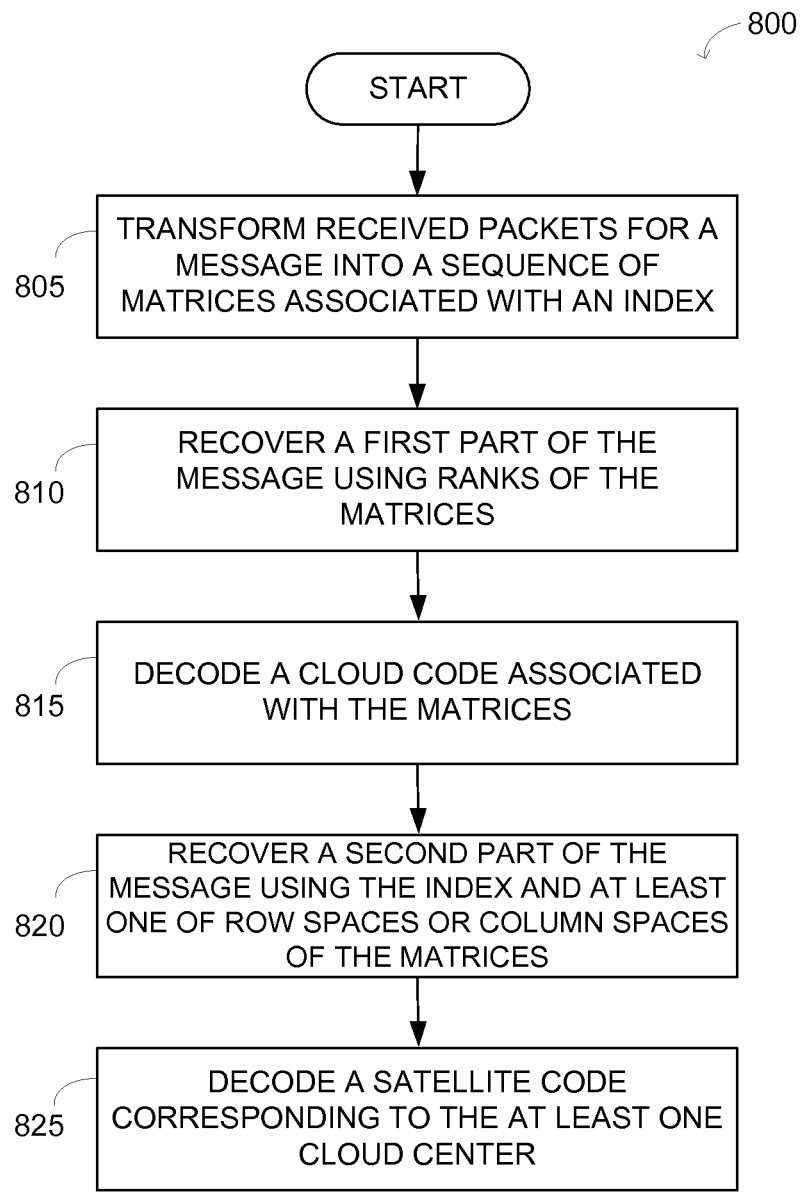
FIG. 8 shows a flow chart illustrating various methods to decode data packets, according to various embodiments.

Referring to FIG. 8, further computer-implemented methods 800 according to various embodiments are provided. In various embodiments, the methods 800 may begin, at block 805, with transforming one or more received packets for a message into a sequence of matrices. In various embodiments, the index may comprise one or more values indicating at least one cloud center comprising a sequence of integers specifying the rank used to encode the message, for example, by the transmitter (e.g., the source node 502). In one embodiment, for example, the one or more packets may be transmitted from, for example, the transmitter (e.g., the source node 502) via the intermediate node (e.g., the accelerator 504).

In various embodiments, at block 810, a first part of the message may be recovered using ranks of the matrices in various embodiments, at block 815, the recovering of the first part may comprise decoding a cloud code associated with the matrices to retrieve an index comprising one or more values indicating the at least one cloud center used to encode the message. In one embodiment, for example, the ranks of the matrices, such as $Y_1, \ldots, Y_n$ associated with the received packets may be used to retrieve the ranks (used to encode the message by the transmitter) from the cloud code associated with the matrices.

In various embodiments, at block 820, a second part of the message may be recovered using the retrieved index and at least one of row spaces or column spaces of the matrices. In various embodiments, at block 825, the recovering of the second part may comprise decoding a satellite code corresponding to the at least one cloud center. In various embodiments, the decoding of the satellite code may comprise identifying a codeword from the satellite code, wherein a subset of the column space of a matrix in the codeword matches the column space of one or more of the matrices. For example, in one embodiment, continuing with the above example, let $r''$ be the cloud center recovered, to decode the satellite code, a codeword $(B_1, \ldots, B_n)$ may be identified from the satellite code $S(r'')$, wherein the column space of $Y_i$ may be a subset of the column space of $B_i$ for $i=1, \ldots, n$.

Figure 9:
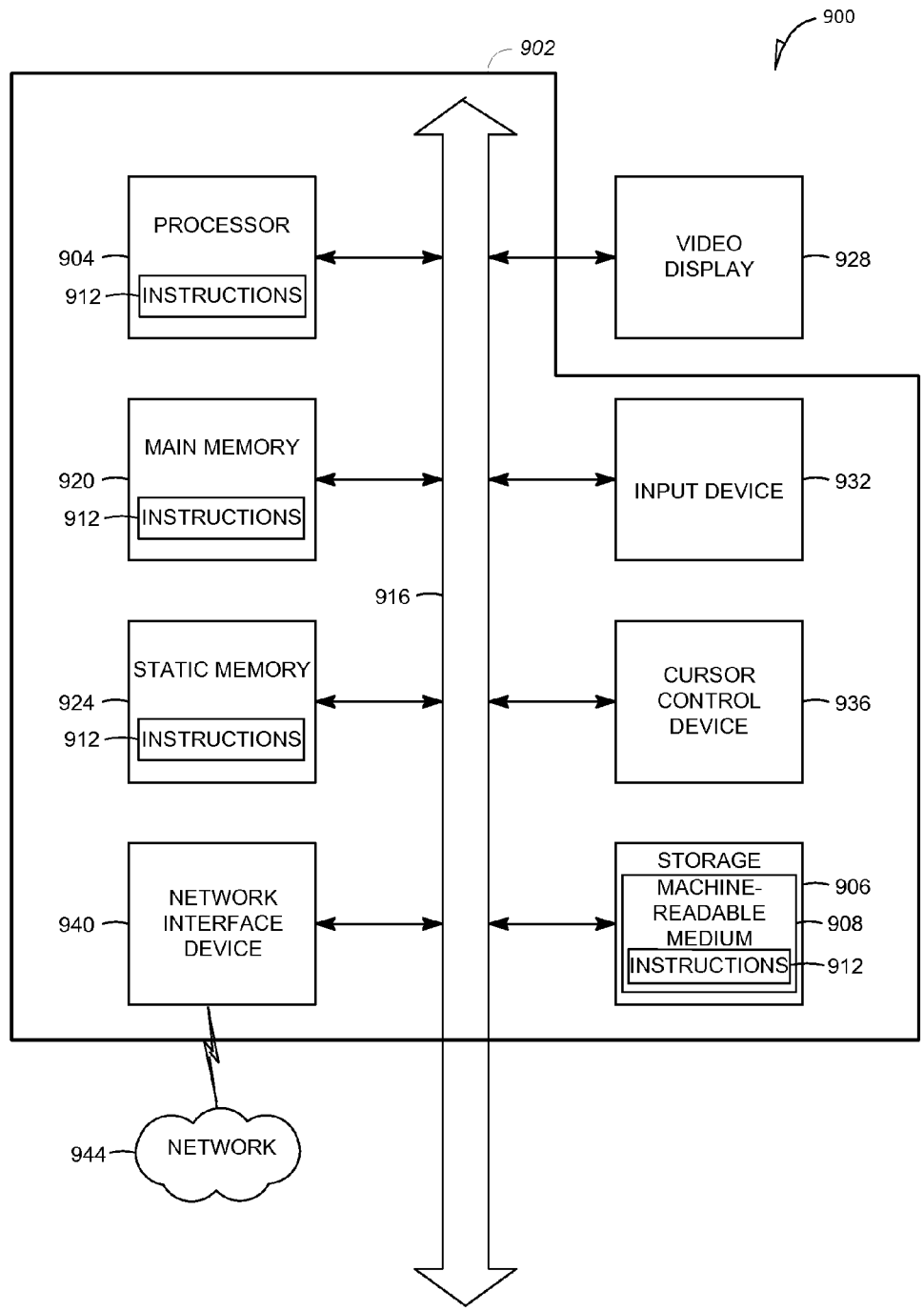
FIG. 9 shows a block diagram of an article of manufacture, including a specific machine, according to various embodiments.

For example, FIG. 9 is a block diagram of an article 900 of manufacture, including a specific machine 902, such as the source node 502, the accelerator 504 or the destination node 506, according to various embodiments. Upon reading and comprehending the content of this disclosure, one of ordinary skill in the art will understand the manner in which a software program can be launched from a computer-readable medium in a computer-based system to execute the functions defined in the software program.

One of ordinary skill in the art will further understand the various programming languages that may be employed to create one or more software programs designed to implement and perform the methods disclosed herein. The programs may be structured in an object-oriented format using an object-oriented language such as Java or C++. In some embodiments, the programs can be structured in a procedure-oriented format using a procedural language, such as assembly or C. The software components may communicate using any of a number of mechanisms well known to those of ordinary skill in the art, such as application program interfaces or interprocess communication techniques, including remote procedure calls. The teachings of various embodiments are not limited to any particular programming language or environment. Thus, other embodiments may be realized.

For example, the article 900 of manufacture, such as a computer, a memory system, a magnetic or optical disk, some other storage device, and/or any type of electronic device or system may include one or more processors 904 coupled, for example, via a bus 916 to a non-transitory machine-readable medium 908 such as a memory (e.g., removable storage media, as well as any memory including an electrical, optical, or electromagnetic conductor) having instructions 912 stored thereon (e.g., computer program instructions), which when executed by the one or more processors 904 result in the machine 902 performing any of the actions described with respect to the methods above.

The machine 902 may take the form of a specific computer system having the one or more processors 904 coupled to a number of components directly, and/or using the bus 916. Thus, the machine 302 may be similar to or identical to the apparatuses 502, 504, 506 or system 500 shown in FIG. 5.

Turning now to FIG. 9, it can be seen that the components of the machine 902 may include main memory 920, static or non-volatile memory 924, and mass storage 906. Other components coupled to the one or more processors 904 may include an input device 932, such as a keyboard, or a cursor control device 936, such as a mouse. An output device 928, such as a video display, may be located apart from the machine 902 (as shown), or made as an integral part of the machine 902.

A network interface device 940 to couple the one or more processors 904 and other components to a network 944 may also be coupled to the bus 916. The instructions 912 may be transmitted or received over the network 944 via the network interface device 940 utilizing any one of a number of well-known transfer protocols (e.g., HyperText Transfer Protocol and/or Transmission Control Protocol). Any of these elements coupled to the bus 916 may be absent, present singly, or present in plural numbers, depending on the specific embodiment to be realized.

The one or more processors 904, the memories 920, 924, and the storage device 906 may each include instructions 912 which, when executed, cause the machine 902 to perform any one or more of the methods described herein. In some embodiments, the machine 902 operates as a standalone device or may be connected (e.g., networked) to other machines. In a networked environment, the machine 902 may operate in the capacity of a server or a client machine in server-client network environment, or as a peer machine in a peer-to-peer (or distributed) network environment.

The machine 902 may comprise a personal computer (PC), a tablet PC, a set-top box (STB), a PDA, a cellular telephone, a web appliance, a network router, switch or bridge, server, client, or any specific machine capable of executing a set of instructions (sequential or otherwise) that direct actions to be taken by that machine to implement the methods and functions described herein. Further, while only a single machine 902 is illustrated, the term "machine" shall also be taken to include any collection of machines that individually or jointly execute a set (or multiple sets) of instructions to perform any one or more of the methodologies discussed herein.

While the machine-readable medium 908 is shown as a single medium, the term "machine-readable medium" should be taken to include a single medium or multiple media (e.g., a centralized or distributed database, and/or associated caches and servers, and or a variety of storage media, such as the registers of a corresponding one of the one or more processors 904, memories 920, 924, and the storage device 906 that store the one or more sets of instructions 312). The term "machine-readable medium" shall also be taken to include any medium that is capable of storing, encoding or carrying a set of instructions for execution by the machine and that cause the machine 902 to perform any one or more of the methodologies of the present invention, or that is capable of storing, encoding or carrying data structures utilized by or associated with such a set of instructions. The terms "machine-readable medium" or "computer-readable medium" shall accordingly be taken to include tangible media, such as solid-state memories and optical and magnetic media.

Various embodiments may be implemented as a stand-alone application (e.g., without any network capabilities), a client-server application or a peer-to-peer (or distributed) application. Embodiments may also, for example, be deployed by Software-as-a-Service (SaaS), an Application Service Provider (ASP), or utility computing providers, in addition to being sold or licensed via traditional channels.

CONCLUSION

Various embodiments of the invention address the network coding based on the superposition structure. For example, codes according to various embodiments may refine coding structures that have not been unveiled under the KK subspace coding framework. The coding problems exposed here may be studied in future works.

The accompanying drawings that form a part hereof show, by way of illustration and not of limitation, specific embodiments in which the subject matter may be practiced. The embodiments illustrated are described in sufficient detail to enable those skilled in the art to practice the teachings disclosed herein. Other embodiments may be utilized and derived therefrom, such that structural and logical substitutions and changes may be made without departing from the scope of this disclosure. This Detailed Description, therefore, is not to be taken in a limiting sense, and the scope of various embodiments is defined only by the appended claims and the full range of equivalents to which such claims are entitled.

Such embodiments of the inventive subject matter may be referred to herein individually or collectively by the term "invention" merely for convenience and without intending to voluntarily limit the scope of this application to any single invention or inventive concept, if more than one is in fact disclosed. Thus, although specific embodiments have been illustrated and described herein, any arrangement calculated to achieve the same purpose may be substituted for the specific embodiments shown. This disclosure is intended to cover any and all adaptations or variations of various embodiments. Combinations of the above embodiments and other embodiments not specifically described herein will be apparent to those of skill in the art upon reviewing the above description.

The Abstract of the Disclosure is provided to comply with 37 C.F.R. §1.72(b) requiring an abstract that will allow the reader to quickly ascertain the nature of the technical disclosure. It is submitted with the understanding that it will not be used to interpret or limit the scope or meaning of the claims. In the foregoing Detailed Description, various features are grouped together in a single embodiment for the purpose of streamlining the disclosure. This method of disclosure is not to be interpreted to require more features than are expressly recited in each claim. Rather, inventive subject matter may be found in less than all features of a single disclosed embodiment. Thus the following claims are hereby incorporated into the Detailed Description, with each claim standing on its own as a separate embodiment.

The invention claimed is:

1. A computer-implemented method, comprising:
encoding a first part of a message into an index using a cloud code; and
encoding, using one or more processors, a second part of the message into a sequence of matrices using a satellite code such that at least one of row spaces or ranks of the matrices is determined by the index.

2. The method of claim 1, wherein the index comprises one or more values indicating at least one cloud center comprising at least one of a first sequence of subspaces or a second sequence of integers specifying the rank.

3. The method of claim 2, wherein the sequence of matrices comprises a codeword indicating the satellite code corresponding to the at least one cloud center.

4. The method of claim 1, further comprising:
transmitting each matrix of the matrices over a network separately from other matrices.

5. The method of claim 1, further comprising:
transmitting a plurality of columns of at least one matrix of the matrices over a network using a same number of data packets as the plurality.

6. The method of claim 1, further comprising:
performing linear network coding of data packets associated with one or more of the matrices.

7. The method of claim 6, wherein the linear network coding is performed by an intermediate node separate from a source node and a destination node.

8. The method of claim 6, wherein the linear network coding is performed based on determining that the data packets correspond to columns of one of the matrices.

9. The method of claim 6, wherein a network transfer matrix used for the linear network coding is not revealed to a source node or to a destination node.

10. A computer-implemented method, comprising:
transforming one or more received packets associated with a message into a sequence of matrices;
recovering by a transmitter a first part of the message using a first one of row spaces or column spaces of the matrices; and
recovering, using one or more processors, a second part of the message using an index and a second one of the row or column spaces of the matrices.

11. The method of claim 10, wherein the recovering of the first part comprises:
decoding a cloud code associated with the matrices to retrieve the index comprising one or more values indicating at least one cloud center used to encode the message.

12. The method of claim 11, wherein the recovering of the second part comprises:
decoding a satellite code corresponding to the at least one cloud center using the at least one cloud center.

13. The method of claim 12, wherein the decoding of the satellite code comprises:
identifying a codeword from the satellite code, wherein a subset of the column space of a matrix in the codeword matches the column space of one or more of the matrices.

14. The method of claim 12, further comprising:
determining an error in the decoding of the satellite code based on identifying more than one codeword from the satellite code, wherein a subset of the column space of each identified codeword matches the column space of the matrices.

15. A computer-implemented method, comprising:
transforming one or more received packets associated with a message into a sequence of matrices;
recovering by a transmitter a first part of the message using ranks of the matrices; and
recovering, using one or more processors, a second part of the message using an index and at least one of row spaces or column spaces of the matrices.

16. The method of claim 15, wherein the index comprises one or more values indicating at least one cloud center comprising a sequence of integers specifying the ranks.

17. An apparatus, comprising:
one or more processors to execute a network message module configured to:
encode a first part of a first message into a first index using a cloud code; and
encode a second part of the first message into a first sequence of matrices such that at least one of row spaces or ranks of the matrices in the first sequence are determined by the first index.

18. The apparatus of claim 17, wherein the network message module is configured to:
transform one or more received packets associated with a second message into a second sequence of matrices using a satellite code;
recover a first part of the second message using a first one of row spaces and column spaces of the matrices in the second sequence; and
recover a second part of the second message using the first part of the second message and a second one of the row and column spaces of the matrices in the second sequence.

19. The apparatus of claim 17, wherein the network message module is configured to:
transform one or more received packets associated with a second message into a second sequence of matrices;
recover a first part of the second message using ranks of the matrices in the second sequence; and
recover a second part of the second message using the first part of the second message and at least one of row spaces or column spaces of the matrices in the second sequence.

20. A non-transitory machine-readable storage device storing instructions that, when executed by one or more processors, cause the machine to perform:
encoding a first part of a message into an index using a cloud code; and
encoding, using one or more processors, a second part of the message into a sequence of matrices using a satellite code such that at least one of row spaces or rank of the matrices is determined by the index.

* * * * *